US010051729B2

(12) United States Patent
Davis et al.

(10) Patent No.: US 10,051,729 B2
(45) Date of Patent: Aug. 14, 2018

(54) CONFIGURATION ELEMENT FOR PRINTED CIRCUIT BOARD ASSEMBLIES

(71) Applicant: Seagate Technology LLC, Cupertino, CA (US)

(72) Inventors: David Michael Davis, Hampshire (GB); Gary Edward Webb, Cumming, GA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/271,525

(22) Filed: Sep. 21, 2016

(65) Prior Publication Data
US 2018/0084634 A1 Mar. 22, 2018

(51) Int. Cl.
*H05K 7/00* (2006.01)
*H05K 1/02* (2006.01)
*H05K 3/34* (2006.01)
*H05K 1/18* (2006.01)

(52) U.S. Cl.
CPC ........... *H05K 1/029* (2013.01); *H05K 1/0243* (2013.01); *H05K 1/0245* (2013.01); *H05K 1/181* (2013.01); *H05K 3/3436* (2013.01); *H05K 2201/10212* (2013.01); *H05K 2201/10719* (2013.01); *H05K 2201/10734* (2013.01)

(58) Field of Classification Search
USPC ......................................... 361/777; 307/147
See application file for complete search history.

(56) References Cited

U.S. PATENT DOCUMENTS

| 4,885,662 | A | 12/1989 | Bartholomew et al. |
| 6,060,901 | A | 5/2000 | Davis |
| 6,113,260 | A | 9/2000 | Genrich et al. |
| 6,573,620 | B1* | 6/2003 | Craig ..................... H05K 1/141 307/130 |
| 6,646,890 | B1 | 11/2003 | Byers et al. |
| 6,732,266 | B1 | 5/2004 | Anderson et al. |
| 6,936,775 | B2 | 8/2005 | Jiang et al. |
| 7,082,487 | B2 | 7/2006 | Darwish et al. |
| 7,502,882 | B2 | 3/2009 | Stahl et al. |
| 7,539,026 | B2 | 5/2009 | Finnerty et al. |
| 7,618,283 | B1 | 11/2009 | Costello |
| 7,746,654 | B2 | 6/2010 | Franz et al. |
| 7,800,894 | B2 | 9/2010 | Davis |

(Continued)

*Primary Examiner* — Andargie M Aychillhum
(74) *Attorney, Agent, or Firm* — Kagan Binder, PLLC (57) ABSTRACT

A printed circuit board assembly includes a printed circuit board having a plurality of signal lanes. The PCBA also includes at least one application-specific integrated circuit operatively mounted to the printed circuit board and connected with the plurality of signal lanes. The PCBA includes a first configuration element operatively mounted to the printed circuit board in a first orientation and at a first location and having a first bridging element for providing an electrical connection between at least a first pair of signal lanes selected from the plurality of signal lanes. The first configuration element also includes a second bridging element so that if the first configuration element were operatively mounted to the printed circuit board in a different, second orientation relative to the printed circuit board, the second bridging element would provide an electrical connection between at least a second pair of signal lanes.

19 Claims, 7 Drawing Sheets

(56) References Cited

U.S. PATENT DOCUMENTS

| | | |
|---|---|---|
| 8,772,931 B2 | 7/2014 | Tailliet |
| 2003/0176013 A1 | 9/2003 | Baker |
| 2004/0141285 A1 | 7/2004 | Lefebvre et al. |
| 2007/0090511 A1* | 4/2007 | Borland ............ H01L 23/49822 257/691 |
| 2015/0234726 A1 | 8/2015 | Moran et al. |
| 2015/0349661 A1 | 12/2015 | Kunin et al. |

* cited by examiner

CONFIGURATION ELEMENT FOR PRINTED CIRCUIT BOARD ASSEMBLIES

BACKGROUND

Aspects of the present invention are directed to printed circuit board assemblies, and in particular to printed circuit board assemblies capable of multiple applications.

Printed circuit board assemblies (PCBAs), to be cost effective, generally can be manufactured in high volume in order to realize economies of scale. Design and manufacturing of PCBAs generally dictate that each of the unique variants requires substantial volume to become profitable. Although a PCBA can be expensive to design and manufacture, subsequent copies of the PCBA may amortize the initial costs of design, tooling, or manufacturing.

For certain PCBAs, there may be a desire to satisfy as many configurations with as few new designs as possible. There may also be a desire to reduce production or design costs of variations of PCBAs through simplification and reduction of redundancies in PCBA design or manufacture.

SUMMARY

In one aspect of the present disclosure, a printed circuit board assembly (PCBA) includes the ability to be reconfigured. The PCBA includes a printed circuit board having a plurality of signal lanes. The PCBA also includes at least one application-specific integrated circuit operatively mounted to the printed circuit board and connected with the plurality of signal lanes. The PCBA also includes a first configuration element operatively mounted to the printed circuit board in a first orientation and at a first location and having a first bridging element for providing an electrical connection between at least a first pair of signal lanes selected from the plurality of signal lanes. According to this aspect of the present invention, the first configuration element can also include a second bridging element so that if the first configuration element were operatively mounted to the printed circuit board in a different, second orientation relative to the printed circuit board, the second bridging element would provide an electrical connection between at least a second pair of signal lanes selected from the plurality of signal lanes.

A second aspect of the present invention is directed to a method of making a printed circuit board assembly (PCBA). The method includes mounting at least an application-specific integrated circuit to a printed circuit board and connecting the application-specific integrated circuit with a plurality of signal lanes. The method also includes mounting a first configuration element to the printed circuit board in a first orientation, the first configuration element including a first set of bridging elements and a second set of bridging elements. The method also includes electrically connecting at least a bridging element of the first set of bridging elements between at least a pair of signal lanes of the printed circuit board without electrically connecting any bridging element of the second set of bridging elements between any signal lanes of the printed circuit board.

Another aspect of the present invention is directed to a variation of printed circuit board assembly (PCBA) and its ability to be reconfigured. The PCBA includes a printed circuit board having a plurality of signal lanes. The PCBA also include at least one application-specific integrated circuit operatively mounted to the printed circuit board and connected with the plurality of signal lanes. The PCBA also includes a first primarily passive configuration element operatively mounted to the printed circuit board in a first orientation and having a first bridging element for providing an electrical connection between at least a first pair of signal lanes selected from the plurality of signal lanes. According to this aspect of the present invention, if a second primarily passive configuration element has a different, second bridging element that is operatively mounted to the printed circuit board in place of the first configuration element, the second bridging element would provide an electrical connection between at least a second pair of signal lanes selected from the plurality of signal lanes.

Yet another aspect of the present invention is directed to a configuration module configured for operative mounting to a printed circuit board (PCB) in a first orientation and at a first location and having a first bridging element for providing electrical connection between at least a first pair of signal lanes selected from a plurality of signal lanes of the PCB. The configuration module also includes a second bridging element that is configured to provide electrical connection between at least a second pair of signal lanes selected from the plurality of signal lanes of the PCB when the configuration module is operatively mounted to the PCB in a different, second orientation relative to the printed circuit board.

These and various other features and advantages will be apparent from a reading of the following detailed description.

BRIEF DESCRIPTION OF THE DRAWINGS

The invention may be more completely understood in consideration of the following detailed description of various embodiments of the invention in connection with the accompanying drawing, in which.

DETAILED DESCRIPTION

Various application-specific PCBAs may contain similar circuitry and configurations to other PCBAs, where only minor variations may distinguish one PCBA from another PCBA. Indeed, many variations of PCBAs utilize virtually identical componentry, but are arranged and connected differently. A system arrangement may include two or more separate and removable PCBAs, with each PCBA mounted in a housing for handing, insertion, or extraction with respect to system equipment. Such removable PCBAs may be considered modules and may be configured to provide a High Availability (HA) system. For instance, one situation may require peripheral component interconnect express (PCIe) links between the various PCBAs. The links may also be known as inter-canister links, and may be selected due to a particular desired software configuration. Another situation may instead utilize Serial Attached SCSI ("SAS") inter-canister links. Yet another situation may not warrant inter-canister links at all. Similar considerations exist for SAS bandwidth (e.g., a number of usable SAS lanes present) to various storage devices (e.g., hard disk or solid-state drives), as opposed to the SAS bandwidth going to the outside world via connectors on the front panel of a PCBA or PCBA module. An example of a PCBA is an application controller PCBA that is configured for one or more functions, such as redundant array of independent disks (RAID), de-duplication, compression, etc.

Variations of computer systems, for example storage systems, may utilize a number of differentiated PCBAs using substantially the same components and similar topology, but having minor differences that currently necessitate production of multiple different PCBA variations. Manufacturers of PCBAs often design and produce a number of similar PCBA component configurations based on different system configurations.

One example of a PCBA is used in an application controller PCBA module. Application controllers may be used in storage environments, such as modular storage enclosures for use in server or cloud environments, among others. One example variation for an application controller in a storage environment may involve a connection from a SAS application-specific integrated circuit (ASIC), such as an input/output controller (IOC), which may benefit from a cross-midplane (internal to a server or datacenter) connection to a partner controller and/or a direct connection to a another ASIC, such as a fanout expander. Examples of connections are signal lanes, which may be configured to transmit and/or receive electricity, data, light, or other information. Examples of signal lanes include SAS signal lanes or PCIe signal lanes, among others.

A fanout expander, or fanout for short, may utilize an SAS architecture, and may enable multiple-port control of multiple components using an expander backplane. An example fanout expander may be an ASIC and may act as a switch, directing high-speed signal traffic from various input ports to various output ports. A specific fanout expander may have, for example, eight input ports and 24 output ports, and the fanout expander may switch signal traffic from an input port to an output port, according to a desired destination, as appropriate. A desired destination may include a data storage device. An expander backplane can be a passive component that connects to various components directly. A number of cables, connections, traces, or signal lanes may be used to connect to various components, based on bandwidth needs. Application controllers may include one or more signal lanes to a front panel or access panel of a server in order to provide connectivity external to a server.

Figure 1A:
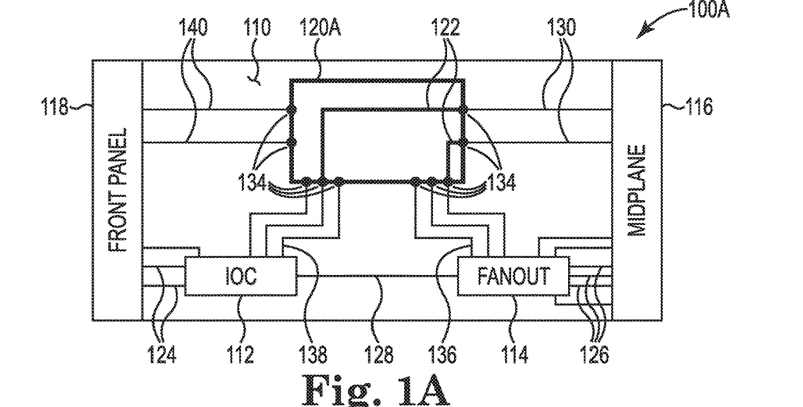
FIGS. 1A-1C illustrate three examples of application controller printed circuit board assembly (PCBA) configurations using a common application controller PCBA, each having an operatively mounted application-specific configuration element, according to various embodiments.
Figure 1B:
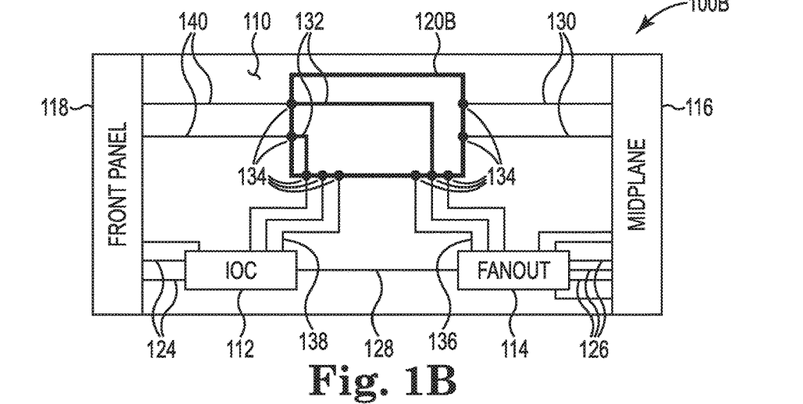
Figure 1C:
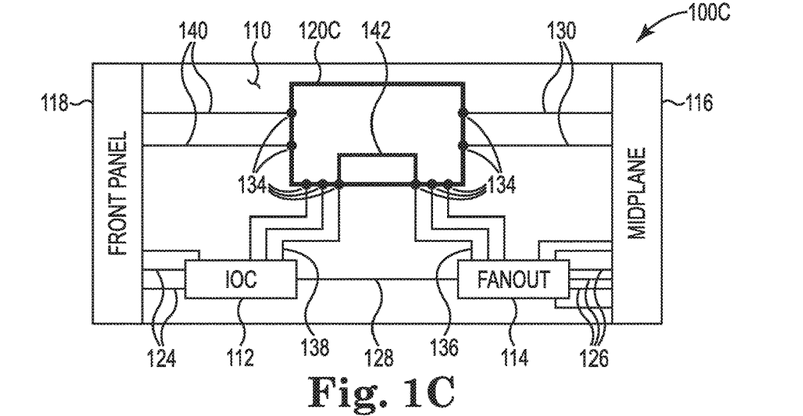

FIGS. 1A-1C illustrate three examples of application controller PCBA configurations using a common application controller PCBA, each having an operatively mounted application-specific configuration element (120A, 120B, 120C), according to various embodiments.

FIG. 1A illustrates a first application controller PCBA configuration 100A using a common application controller PCBA 110 with a first configuration element 120A, according to various embodiments. In some embodiments, first configuration element 120A can be referred to as a configuration module.

A typical application controller is a form of PCBA that includes various components, circuitry, connectors, and ports. For example, an application controller PCBA 110 may include components such as one or more ASICs, including input/output controllers (IOC) 112, fanout expanders 114 (e.g., a serial-attached small computer system interface (SAS) fanout expander), a central processing unit (and associated memory and other components) or an Ethernet switch. Also included on the application controller PCBA 110 may be a front access panel 118, and/or a midplane connection interface 116, also referred to as simply midplane 116. The various components may communicate with one another using PCBA signal lanes (e.g., 124, 126, 128, 130, 136, 138, 140), and may utilize significant bandwidth during communication. Signal lanes may be referred to as connections, and vice-versa, and a signal lane may include multiple transmission, receiving, and/or ground connections. For example, a signal lane may include individual connections, such as one or more transmit differential pair, one or more receive differential pair, with the various connections separated by ground connections to reduce disturbance or cross-talk between the various connections. One typical example signal lane includes seven individual connections. Typically, signal lanes between the various components are fixed in the PCBA 110, causing a lack of flexibility and configurability after design and manufacture of PCBA 110. The various components may have a fixed number of connections or contact points for use with the signal lanes, which may limit communication based on the nature of the various components.

However, by routing a number of signal lanes from the various components to one or more centralized locations (which may not be physically centered) on an application controller PCBA 110, an interface (e.g., ball grid or land grid) or socket for operatively mounting a configuration element 120A may provide advantageous configurability to the PCBA 110 and may effectively add additional contact point and signal lane functionality to the various components. Connections between key components, such as IOC 112 and front panel 118 (signal lanes 124), and fanout expander 114 and midplane 116 (signal lanes 126) may be supplemented by selecting a configuration element from options 120A, 120B, and 120C, having respective bridging elements 122, 132, and 142. Bridging elements (122, 132, and 142) may include connections, such as signal lanes, electrical traces, or vias. By rearranging, redesigning, and/or replacing a small, relatively simple, and inexpensive configuration element, such as 120A, the cost and manufacture of future configurations of PCBA 110 is generally prospectively limited to the configuration element 120A.

As depicted, PCBA 110, with operatively mounted first configuration element 120A having bridging elements 122, is configured to connect an IOC 112 and a fanout expander 114 to a midplane connection interface 116, using bridging element 122, which may bridge various configuration element 120A contact points 134, according to various embodiments. Fanout expander 114 may be a serial-attached SCSI (SAS) fanout expander, according to various embodiments. Midplane 116 may be configured to allow PCBA 110 to interface with other components, such as additional application controller PCBAs (not shown), which may be similar to PCBA 110, according to various embodiments. IOC 112 may include signal lanes 124 connecting to a front panel 118, which may permit external connections via cabling, etc. (not shown). Fanout expander 114 may include signal lanes 126 to midplane 116. The IOC 112 and the fanout expander 114 may be directly connected with one or more signal lanes 128.

Configuration element 120A, as shown, includes contact points 134 for connection between the bridging elements 122 and various PCBA 100A signal lanes, such as midplane-to-configuration element signal lanes 130, front-panel-to-bridging element signal lanes 140s, fanout 114 to configuration element 120A signal lanes 136, and IOC 112 to configuration element 120A signal lanes 138. Bridging elements may include various types of connections. Connections, as used herein, may include electrical traces, signal lanes, vias, etc., and may be used interchangeably where appropriate and/or applicable. Connections used may preferably be high-density connections that may have a reduced impact on signal integrity.

Configuration element 120A may be passive or primarily passive, according to various embodiments. Passive, for the purposes of this disclosure and with reference to configuration element 120A, denotes that while electric power may flow through configuration element 120A from one component to another on PCBA 110, a negligible or insubstantial amount of electric power is required and/or intended for the configuration element 120A itself to function. Additionally, substantially no electric power (e.g., electrical current) is drawn (e.g., used or converted) by a passive configuration element 120A. However, a passive configuration element 120A can route more substantial electric power (e.g., electrical current) through the configuration element 120A from one component to another component of the PCBA 110, without configuration element 120A becoming active or actively switching routing of the electric power during operation of PCBA 110. A passive configuration element 120A may lack active components in a particular data path (defined by bridging elements 122 or signal lanes, as described herein). However, a passive configuration element 120A may include various forms of incidental and/or non-interfering data path monitoring, such as thermal monitoring, which may not directly affect the data path, thus remaining passive. According to various embodiments, bridging elements 122 may be passive.

In contrast to an example passive configuration element 120A, a primarily passive configuration element 120A or component may include signal re-drive components along with any of the connection systems, as described herein. For example, if the primarily passive configuration element 120A re-routes a signal from a relatively short trace (e.g., to the front panel 118 of the PCBA 110) to a longer trace, (e.g. out of the configuration element 120A and across a midplane to another module), then a re-drive circuit may be employed on a primarily passive configuration element 120A itself or otherwise. A re-drive circuit may be utilized in a primarily passive configuration element 120A, but may amplify a signal to be transmitted across configuration element 120A without substantially altering the signal, and may be considered to be incidental and non-interfering on a signal traversing configuration element 120A. A configuration element 120A may be considered primarily passive even with a relatively small degree or quantity of active, incidental electronic (e.g., silicon or semiconductor-based) components, or the influence of an active component that is not located on the configuration element 120A.

However, in other embodiments, the configuration element 120A or another component of a PCBA 110 may instead be active (and therefore, neither passive nor primarily passive). Other active features (e.g., silicon or semiconductor switches) may also be added to the configuration element 120A, forming an active configuration element 120A. Similar features that define an active device may yet be located on other components of the PCBA 110 than the configuration element 120A. Such active features located on PCBA 110 may allow a passive or primarily passive configuration element 120A to benefit from the active features of PCBA 110 while maintaining a passive or primarily passive (and more easily interchangeable) nature. Some typical examples of active features include diverse substantial semiconductor components, multiplexing components, de-multiplexing components, and PCIe switches. Additional contact points 134 may be added to the configuration element 120A, for example, where the contact points 134 are configured to provide power to an active component.

Bridging elements 122 may be configured such that IOC 112 and fanout expander 114 are operatively coupled, e.g., by bridging, therefore allowing at least one additional signal lane connection for midplane 116, as may be desirable for various situations. According to the shown embodiment, configuration element 120A may add functionality of one or more signal lanes (e.g., four signal lanes) from the IOC 112 to the midplane 116 and may add one or more signal lanes from the fanout expander 114 to the midplane 116. Two bridging elements 122 are depicted in configuration element 120A, but more or fewer bridging elements 122 may be added, and any number of PCBA 110 components may be connected in various ways.

Previously, complex components or the entire PCBA 110 would need to be changed for even slightly different configurations. Utilizing a configuration element 120A, according to the present disclosure, may thus allow a static multi-purpose PCBA 110 to remain constant and unchanged even with future implementations of variations to functionality. As layouts, demands, clients, and storage devices constantly change, future variations on the PCBA 110 may not be initially contemplated or predicted. However, unforeseen variations may still be practical using later-derived configuration elements (not shown), allowing for a possible longer useful life of a particular PCBA 110, potentially saving substantial costs related to research and development, complex layout design, and manufacturing, among others.

Before a PCBA 110 can be produced with an intent to introduce configurability via a configuration element 120A, desired configurations may be received and analyzed in order to determine which configurations would be most efficient to group together as configurations using the same components on a PCBA 110, but routed differently, as described herein. Alternatively, a PCBA 110 layout can be produced and changes for other variations can be made at a later time based on a predetermined PCBA 110 layout.

FIG. 1B depicts a second application controller PCBA 100B configuration using the common application controller PCBA 110 with a second configuration element 120B, according to various embodiments.

A different design or configuration may desire other connectivity than offered by PCBA configuration 100A with associated configuration element 120A. A different configuration element 120B is shown operatively mounted to common PCBA 110 at the same location and in place of the configuration element 120A of FIG. 1A. The configuration element 120B includes bridging elements 132, which may be distinguished from bridging elements 122, in that bridging elements 132 may represent one or more second or alternative bridging elements, according to various embodiments. A PCBA configuration 100B may offer differentiated functionality as compared to the differently-configured PCBA configuration 100A, which employs configuration element 120A. PCBA configuration 100B may be similar to PCBA configuration 100A, but may have various changes, as highlighted above with regard to FIG. 1B.

As depicted, configuration element 120B independently connects IOC 112 and fanout expander 114 to the front panel 118 with bridging elements 132 in addition to front-panel-to-bridging element connections 140 in PCBA 110, which are located outside the configuration element 120B. By adding or activating additional signal lanes 138, 136 from the IOC 112 and fanout expander 114, additional functionality and connectivity may be added to the front panel 118, for example.

FIG. 1C depicts a third PCBA configuration 100C using a common PCBA 110 with a third configuration element 120C, according to various embodiments.

As depicted, PCBA 100C is another variation on the common PCBA 110, but with a configuration element 120C having bridging element 142 connecting the IOC 112 directly to the fanout expander 114 with an additional signal lane connection in order to supplement existing signal lane 128. The bridging element 142 may add to the bandwidth or throughput of signal lane 128, per a need or desire for at least one additional signal lane connection. PCBA configuration 100C may be similar to PCBA configuration 100A, but may have various changes, as highlighted above, with regard to FIG. 1C. One bridging element is shown, but more bridging elements 142 may be included in configuration element 120C and bridging elements 142 may connect various combinations of components differently.

Figure 2:
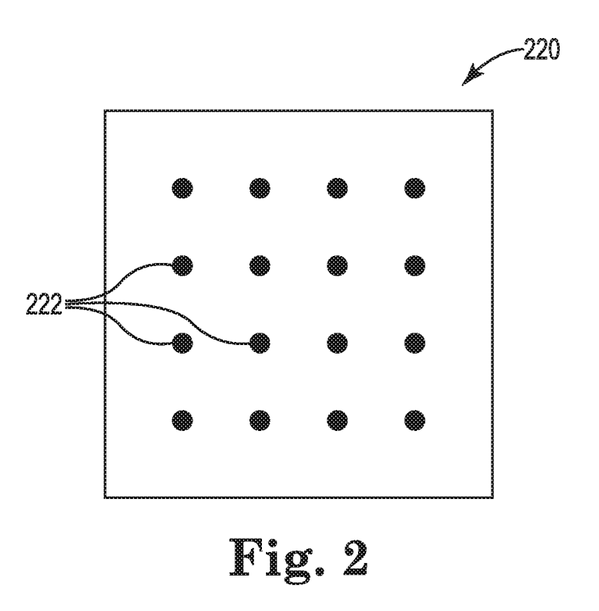
FIG. 2 shows a ball-grid array (BGA) interface such as can be provided at a bottom surface of a configuration element, which may be used to connect the configuration element to a PCBA, according to various embodiments.

FIG. 2 shows a ball-grid array (BGA) interface such as can be provided at a bottom surface of a configuration element 220, which may be used to connect the configuration element 220 to a PCBA, either directly or via a BGA interface or socket of the PCBA (e.g., 110 of FIGS. 1A-1C), according to various embodiments. Configuration element 220 may be similar to configuration elements 120A, 120B, and/or 120C, among others, according to various embodiments.

The configuration element 220 may take various forms, and/or utilize various kinds of connectivity. For example, the configuration element 220 may be a BGA-style passive (or primarily passive) PCBA, a passive (or primarily passive) PCBA mounted using a land grid array (LGA)-style connector, a passive (or primarily passive) PCBA mounted using at least one mezzanine-style connector, or a passive (or primarily passive) PCBA including additional connectors, to provide additional connection options via cables. The BGA may include ball grid contact points 222 configured to electrically bridge components of a PCBA using bridging elements such various connections, as described herein. Ball grid contact points 222 may be similar to contact points 134 of FIGS. 1A-1C, but each contact point 134 of FIGS. 1A-1C may include one or more ball grid contact points 222 for connection to individual connections, as described herein. Each ball grid contact point 222 may connect to an individual connection (not shown). Multiple connections, e.g., seven individual connections, may together form a single signal lane, as described herein.

As shown in FIG. 2, a plurality of ball grid contact points 222 may form a BGA having sixteen ball grid contact points 222. The number of ball grid contact points 222 may vary, and may range from two or three ball grid contact points 222 to multiple hundreds of ball grid contact points, according to various embodiments. A different number of ball grid contact points 222 can be provided on the configuration element 220. A minimum number of three ball grid contact points 222 may allow routing a set of signals from one ball grid contact point 222 to either of the other two ball grid contact points 222, via a bridging element (not shown, e.g., 122, 132, 142), as described herein. Four ball grid contact points 222 would further allow variations and potential rotations of the configuration element, as described in greater detail with regard to FIG. 9. Additionally, a number of ball grid contact points 222 on a configuration element 220 may differ from a number of ball grid contact points 222 located on a PCBA connection (not shown, e.g., a BGA socket or a complex) that is designed to interface with a ball grid contact points 222 of configuration element 220. Flexibility may be improved through various configuration element 220 variations and interface variations on an applicable PCBA (not shown). Configuration element 220 may itself take the form of a passive or primarily passive PCB with a BGA interface.

If a BGA option (as shown) is desired for signal lane connection between a configuration element 220 and a PCBA, various sizing and density options may be selected. An application controller may be configured to accommodate various contact requirements. An example configuration element 220 could be fabricated and then placed on the PCBA as an electrical component. An advantage of utilizing a BGA may include a reduced impact on signal integrity, according to some embodiments. If configuration element 220 is desired to have a low profile, there may be a reduced impact on input/output module airflow, which may benefit thermal conditions and/or cooling of various PCBA components (not shown, e.g., IOC 112 or fanout expander 114 of FIG. 1A-1C).

Creation of the configuration element 220 as a BGA component may have the advantage of minimal signal loss, but may constrain timing of the configuration of an application controller PCBA (not shown) to occur at PCBA build time. In other words, if the configuration element 220 is created as a BGA component and attached to the PCBA during fabrication, then it may preferably be done when the entire PCBA (e.g., 110 of FIGS. 1A-1C) is built. Hence, variants of the BGA-configured PCBA would need to be stocked separately. If the configuration element 220 instead is configured to be removably installed in a socket, then the socket is installed during PCBA fabrication, but can be configured at a later stage using various configuration elements (e.g., 220). Other connection methods using LGA-type sockets, such as Amphenol 'C' Stack, InterCon Systems Inc., Samtec, or other low loss mezzanine-style connectors could also be used and may allow configuration at a different stage of manufacture.

One or more ball grid contact points 222 in the configuration element 220 may also be utilized to determine or indicate to a PCBA which variant of a configuration element 220 is fitted to the PCBA, as further described herein. Multiple versions of configuration elements could be produced to be operatively mounted in the same location on a PCBA. Methods of determining which variation is actually fitted may be advantageous. Such function could be provided by simple Inter-Integrated Circuit ($I^2C$) devices fitted to the configuration element, or even by multiple ball grid contact points 222 being either pulled high or grounded, and their state being read by a control element included on the PCBA.

An example configuration element 220 may be relatively small with respect to a PCBA to which the configuration would be operatively mounted, and may be high-density according to various embodiments. An example high-density configuration element 220 having a BGA-style contact area having 15×15 ball grid contact points 222 (for a total of 225 ball grid contact points 222) at 0.8 mm pitch may fit within an area 12 mm×12 mm on a configuration element 220, according to one embodiment. PCBA surface area and available space may be a limiting factor in configuration element 220 design and construction, especially with respect to a number of high-speed layers on a PCBA, such as 110 of FIGS. 1A-1C. Other example configuration elements may be lower density, if fewer ball grid contact points 222 are required or if a greater area is available for configuration element 220 use. According to one embodiment, the configuration element 220 may be a small, passive or primarily passive PCB, with sufficient routing layers to provide the connectivity desired. Adding a configuration element 220 into high-speed connections may at least partially degrade the signal integrity of the system, so it may be beneficial to utilize a connection method that imposes relatively minimal impact on the signal integrity.

Configuration element 220 may include various alternative connector systems for interfacing the configuration element 220 to a PCBA. BGA and LGA sockets and interfaces are described, but other connection systems or complexes could be used depending on space, signal integrity requirements, etc., for example, a Mini-SAS HD connector (not shown). The Mini-SAS HD connector may allow breakout from, or feed into the configuration element 220, according to various embodiments.

Figure 3:
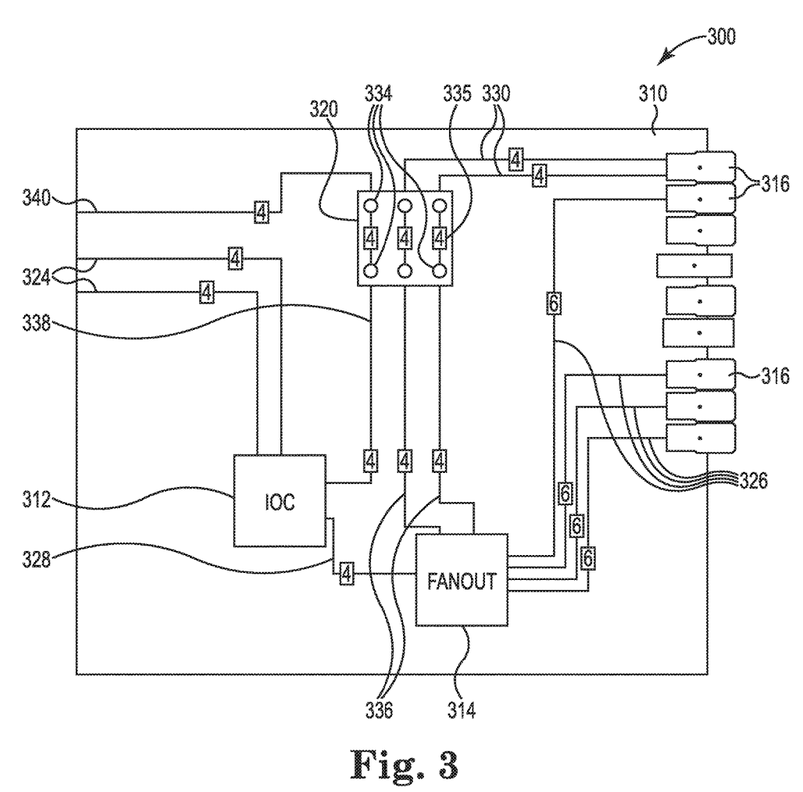
FIG. 3 depicts a schematic configuration of a PCBA with a first configuration element installed thereon, according to various embodiments.

FIG. 3 depicts a schematic configuration 300 of a PCBA 310 with a first configuration element 320 installed thereon, according to various embodiments. Configuration element 320 may be similar to configuration elements 120A, 120B, 120C, and/or 220, among others.

PCBA 310, as shown, may be an application controller that includes at least two application-specific integrated circuits (ASICs), such as an input output controller (IOC) 312 and a fanout expander 314. The PCBA 310 may include a front panel interface (not shown) at left, and a midplane interface through connectors 316 at right. The PCBA also includes an operatively mounted configuration element 320 connected with at least two of the described components. Signal lanes and bridging elements 335 of the configuration element 320 connections may connect various components on the PCBA, according to various embodiments.

The IOC 312 may coordinate input and output communication and signals between components, and may be coupled with sixteen signal lanes shown here as four groups of four signal lanes each (composed of two groups of signal lanes shown at 324, one group shown at 338, and one group shown at 328). The IOC 312 is connected to a front panel (not shown) by signal lanes 324 going to the front of the PCBA 310 for connections to an external cabling system in a server or datacenter (see FIGS. 1A-1C, 118) on the left side of PCBA 310, as illustrated. Four signal lanes 338 are shown connecting IOC 312 to the configuration element 320. Another four signal lanes 328 connect IOC 312 to the fanout expander 314. IOC 312 may be a SAS IOC being driven by PCIe from a CPU (not shown). The various signal lanes described herein may be SAS signal lanes and each may have a bandwidth, according to various embodiments.

The fanout expander 314, as illustrated, may be configured to marshal, split, receive, and otherwise direct various signals through connected signal lanes 326, 328, and 336.

The fanout expander 314 is connected to the IOC 312 by four signal lanes 328, as shown in the depicted configuration 300. Fanout expander 314 is also connected to connectors 316 by four groups of six signal lanes 326 for a total of 24 signal lanes.

Various systems may also benefit from expansion capability through a front panel at left (not shown), hence three groups of four signal lanes 324 and 340 are shown as routing to the front panel of the PCBA 310 module for external connection (such as shown in FIGS. 1A-1C, front panel 118). Various signal lane connections between an IOC 312, or fanout expander 314 and at least one other component may provide different functionality in terms of latency, bandwidth, etc., as well as basic connectivity. The various signal lane connections may be valuable in the architectural design of the overall PCBA 310. The fanout expander 314 may be a SAS fanout expander, herein.

In the shown embodiment, the fanout expander 314 is a 36-port SAS fanout expander (configured for use with 36 signal lanes), but could alternatively be a PCIe or Ethernet switch, or other similar device or structure. The fanout expander 314, as shown, provides 24 signal lanes 326 to the connectors 316 for use with a midplane (not shown, see FIGS. 1A-1C, 116). The midplane may allow for connection to various other PCBAs and/or storage devices, such as hard disk drives or solid state drives, if PCBA 310 is a storage device application controller.

On the right side of PCBA 310 are connectors 316 for taking the signal lanes 326 to a midplane. The depicted configuration shows eight signal lanes (e.g., SAS signal lanes) 324 having two groups of four signal lanes each from the IOC 312 and routes them to a front panel (FIG. 1A-1C, 118) for higher bandwidth external connections (not shown). Also depicted are four signal lanes 328 between IOC 312 and fanout expander 314 (e.g., a SAS fanout expander). As shown, four signal lanes connect IOC 312 to fanout 314.

The configuration element 320 is shown having six contact point groups 334, which may include multiple contact points, such as contact points 134. Each of the contact point groups 334 may include a plurality of signal lane contact points. The six contact point groups 334 are then connected by bridging elements 335 in the shown configuration. Each contact point group 334 may include four contact points for connecting four signal lanes each having a plurality of ball grid contact points 222 for connection to individual connections (e.g., transmission and receiving differential pairs and associated grounds). The depicted signal lanes may be various forms of high-speed signal lanes, according to various embodiments. High-speed signal lanes may have a speed of 1 Gb/s or higher, or 1 GHz or higher, according to various embodiments. Particular examples of high-speed signal lanes may include a 12 Gb/s SAS signal lane or an 8 Gb/s PCIe signal lane. Additionally, to achieve high-speed signal lanes, distortion, noise, and "jitter" may be factored into design, and may be considered during PCBA material selection, physical layout, and signal lane trace length, etc., prior to manufacture.

A central processing unit (CPU) and memory may be communicatively coupled to various components of the application controller PCBA 310, such as IOC 312 or fanout expander 312, but are omitted here for clarity.

Eight signal lanes (two groups of four signal lanes each connected to one contact point group 334) are shown at 330 between the configuration element 320 and connectors 316. These eight signal lanes 330 may be routed a partner application controller PCBA (not shown) via a system midplane (such as shown in FIGS. 1A-1C, 116), according to various embodiments.

Various embodiments, as depicted, are not intended to be limited to a particular infrastructure, such as an SAS infrastructure. PCIe signal lanes could also be routed to the midplane or configuration element 320 to allow PCIe inter-canister links (e.g., from one application controller to another). This could increase the number of contact point groups 334 of the configuration element 320 to eight, according to various embodiments. The configuration element 320 and/or a PCBA 310 may be configured to be protocol agnostic and may be able to carry PCIe, SAS, serial AT attachment (SATA), Ethernet, etc. on the same configuration element 320.

At four signal lanes (and multiple contact points and individual connections per signal lane) per contact point group 334 on the configuration element 320, with the configuration element having six contact point groups 334, a total of 24 (six groups of four) signal lanes are shown as connecting to configuration element 320. Each contact point group 334 having 4 signal lanes may utilize approximately 26-28 individual contact points (2×4 pairs of individual connections, plus interleaving grounds). Additional individual ground connections (e.g., pins or traces) may be added, as needed. For six contact point groups 334 as shown in the above embodiment, four signal lanes each equals four transmission pairs, four receiving pairs, plus grounds may equal roughly 2×((4×2)+(4+1))=26 contacts and individual connections, for six contact points groups 334, or about 156 contacts and individual connections. In one embodiment, 24 signal lanes may include a total of 208 contact points and individual connections, and may be used with eight contact point groups 334 (instead of the shown six).

Figure 4:
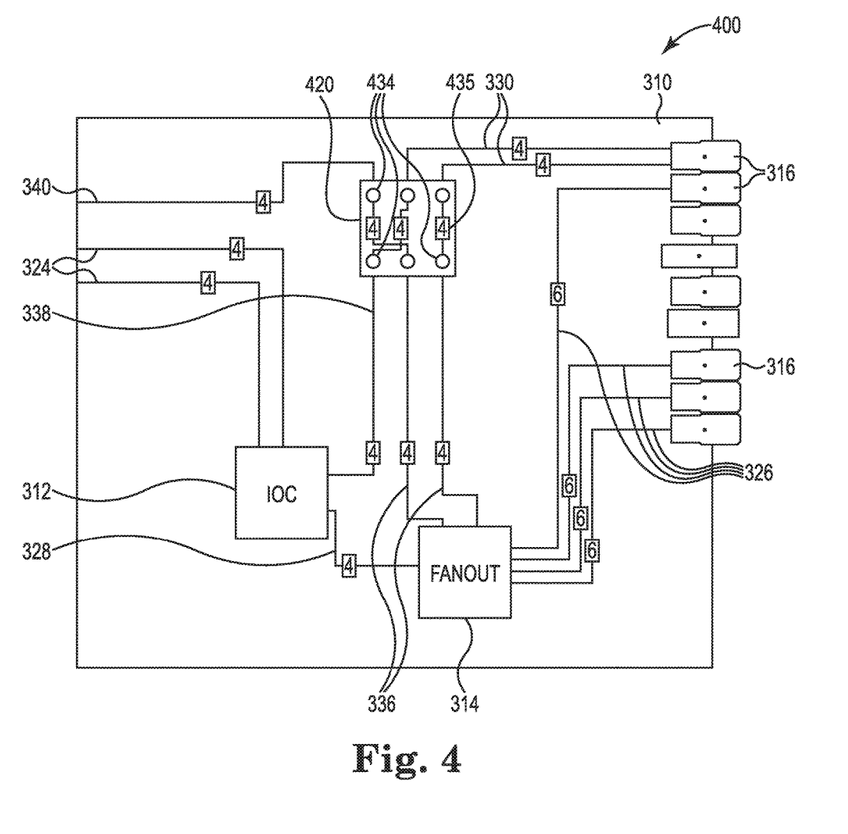
FIG. 4 depicts an alternative schematic configuration of a PCBA with a second, different configuration element installed thereon, according to various embodiments.

FIG. 4 depicts an alternative schematic configuration 400 of a PCBA 310 with a second, different configuration element 420 installed thereon, according to various embodiments.

In an alternative configuration, as depicted, using the same PCBA 310 of FIG. 3, an alternative configuration element 420 is operatively mounted to PCBA 310, and routes four signal lanes 338 from the IOC 312 and routes them to the midplane (FIG. 1A-1C, 116) of the PCBA 310 through signal lanes 330. The PCBA (e.g., an application controller PCBA) may thus be configured for crossover connections to one or more partner application controller PCBAs (not shown) connected to midplane by connectors 316, as opposed to the front panel, as shown in FIG. 3. The configuration element 420, as shown, also routes four SAS signal lanes 336 from the fanout expander 314 to the front panel through signal lanes 340 for use with (e.g., higher bandwidth) external connections (not shown). The configuration element 420 includes bridging elements 435 connecting and routing various contact point groups 434. The configuration element 420, as shown, also takes four signal lanes 336 from the fanout expander 314 to a crossover connection through signal lanes 330, depicted as two groups of signal lanes connected to a same midplane connector 316. As such, the components present on PCBA 310 in FIG. 3 (other than the components of configuration element 320) are still present in FIG. 4, but are connected and utilized differently without changing PCBA 310 beyond the configuration element 420.

Figure 5:
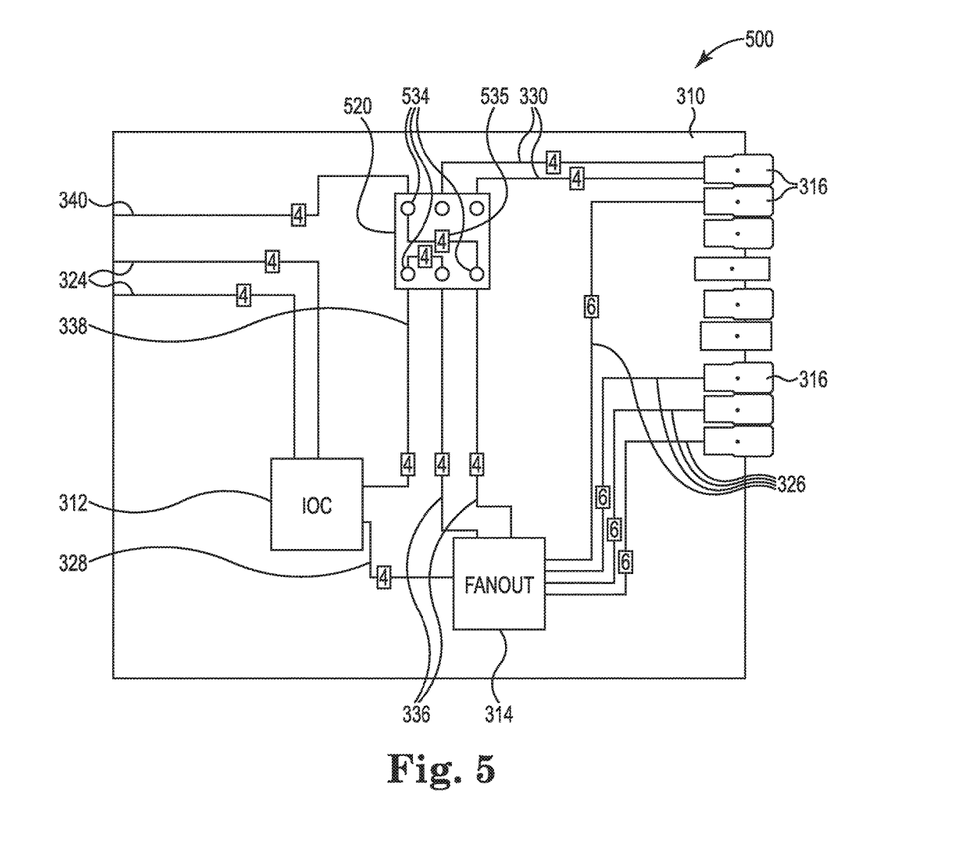
FIG. 5 depicts a schematic configuration of a PCBA with a third, different configuration element installed thereon, according to various embodiments.

FIG. 5 depicts a schematic configuration 500 of a PCBA 310 with a third, different configuration element 520 installed thereon, according to various embodiments.

Alternatively, as shown, a configuration may be desired that lacks a need for inter-controller links to another PCBA (not shown) through midplane connectors 316. A third, different configuration element 520 may then be operatively mounted to PCBA 310, where configuration element 520 routes additional signal lanes 338 (four signal lanes, as shown) from the IOC 312 to the fanout 314 (e.g., an SAS fanout expander) through signal lanes 336 to provide a higher bandwidth to, for example, various drive links. The configuration element 520 includes bridging elements 535 connecting and routing various contact point groups 534. Configuration element 520 through bridging element 535 may also route four signal lanes 336 from the fanout 314 to the front panel (at left) through signal lanes 340, for higher bandwidth or other external connections. As described, by changing the configuration element 520, PCBA 310 may advantageously achieve a different functionality, without requiring a redesign of the PCBA 310. Other variations are also contemplated beyond the shown embodiments of the various configuration elements.

Figure 6:
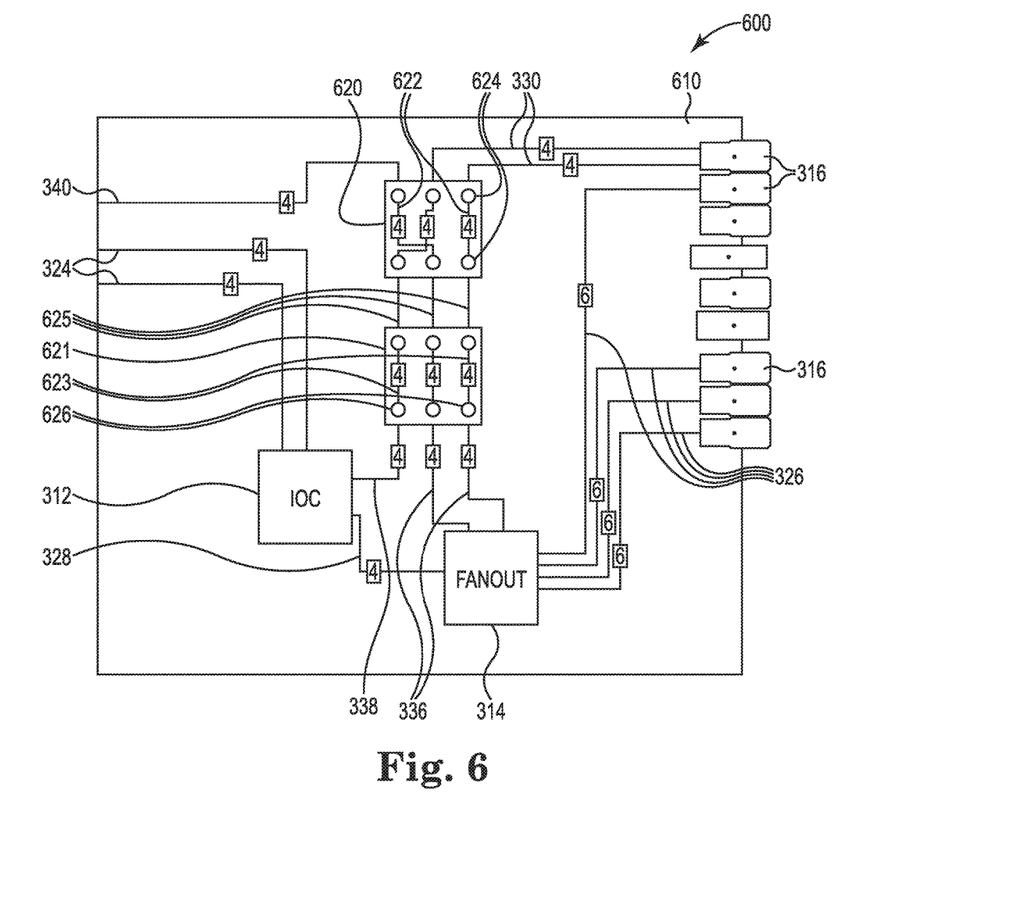
FIG. 6 illustrates a schematic configuration of a PCBA with two configuration elements installed thereon, according to various embodiments.

FIG. 6 illustrates a schematic configuration 600 of a PCBA 610 with two configuration elements installed thereon, according to various embodiments.

PCBA 610 may be similar to PCBA 310, except that PCBA 610 may be configured to operate using more than one configuration element simultaneously, such as a first configuration element 620 and a second configuration element 621. The first and second configuration elements 620 and 621 may be aligned and connected in series, as shown, where one configuration element is configured to receive and transmit signals, and the other configuration element receives and transmits signals in series with the other configuration element, or a combination thereof. According to other embodiments (not shown) multiple configuration elements may be aligned and connected in parallel or other layouts, and may interact with different connections and/or different components. As such, PCBA 610 may be updated or changed to receive configuration elements (such as 620 and 621) differently, according to different configurations and needs. Configuration elements 620 and 621 may be similar to other embodiments of configuration elements as discussed herein, and are each shown having six groups of four signal lanes in various arrangements.

By operatively mounting configuration elements 620, 621 to PCBA 310, configuration element 621 bridging elements 623 route additional signal lanes 338 (four signal lanes, as shown) from the IOC 312 to intermediate signal lanes 625, which then are routed through configuration element 620 bridging elements 622 to midplane by connectors 316, through signal lanes 330, providing a crossover connection to an external PCBA, for example. Configuration element 621 includes six connection point groups 626, which are configured to couple various signal lanes with bridging element 623. Configuration element 620 also includes six connection point groups 624, which are configured to couple various signal lanes with bridging element 622.

Other signal lanes 338 are also routed through configuration element 621 bridging elements 623 to intermediate signal lanes 625, which are routed through configuration element 620 bridging elements 622 to front panel through signal lanes 340. Yet other signal lanes 336 are also routed through configuration element 621 bridging element 623 to intermediate signal lanes 625, which are routed through configuration element 620 bridging elements 622 to the midplane connectors 316 through signal lanes 330. As described, by changing the configuration elements 620, 621, PCBA 310 may advantageously achieve a different functionality, without requiring a redesign of the PCBA 310. Other variations are also contemplated beyond the shown embodiments of the various configuration elements.

Various advantages may be achieved by utilizing more than one configuration element, such as 620 and 621. For example, a fewer number of total configuration elements may be used, and may be inserted into various different receiving locations in a PCBA, such as 610. In one embodiment, two configuration elements 620 and 621 are included on a PCBA 610, where the configuration elements 620, 621 can be rotated and/or swapped to give eight or more different combinations without changing, adding, or removing parts from the PCBA arrangement. Alternatively, a greater degree of configurability may be achieved and more different PCBA components, such as IOC 312 and fanout expander 314 may be connected or able to be connected to a greater number of other components. However, additional surface area of PCBA 610 may be dedicated to placement of the various configuration elements (or configuration components), e.g., 620 and 621. The following description related to FIG. 7 depicts an alternative method that may maximize efficient use of available surface area of a PCBA in question.

Figure 7:
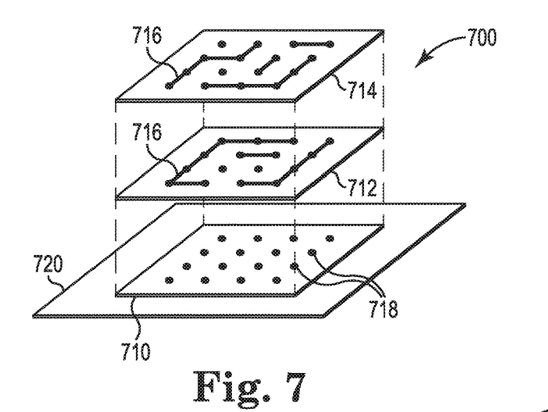
FIG. 7 shows an exploded view of a layer configuration of a configuration element having a stacked layout, according to various embodiments.

FIG. 7 shows an exploded view of a layer configuration 700 of a configuration element having a stacked layout, according to various embodiments.

As depicted, a PCBA base 720 may have a connection array 710 located thereon. The connection array 710 may be configured to interface with a BGA-based configuration element, such as configuration element 220 of FIG. 2. PCBA base 720, as shown, is a simplified view of a PCBA, and may be similar to PCBA 110, 310, or PCBA 610, according to various embodiments. The connection array 710 may be a BGA-style array including a plurality of contact points 718 (e.g., ball grid contact points 222). Connecting to the connection array 710 are shown a first configuration element layer 712 and a second configuration element layer 714. First and second layers 712 and 714 may each be in effect a distinct configuration element, as described, herein, or may together form a single configuration element having multiple layers. Electrical connections 716 may be bridging elements, or parts thereof, and may be located on first and/or second layer 712/714, and may include various connections for connection between layers or from layer to connection array 710 using contact points 718.

By utilizing a multi-layer configuration element layout, various configurations can be used, and various advantages may be experienced. First configuration element layer 712 and second configuration element layer 714 can be sandwiched with other layers. First configuration element layer 712 and second configuration element layer 714 may be selected from a plurality of configuration element layers with distinct bridging elements 716. First configuration element layer 712 and second configuration element layer 714 may be desired depending on whether the layers are parts that form a single configuration element, such as described herein, or multiple configuration element that can stacked in order to increase permutations of functionality of a PCBA, such as 720. Other embodiments described herein may utilize a layered configuration element, as shown. In a layer configuration 700, a first configuration layer 712 may include connectivity, such as to interface with contact points 718, which may be utilized for multiple configuration element embodiments.

Figure 8:
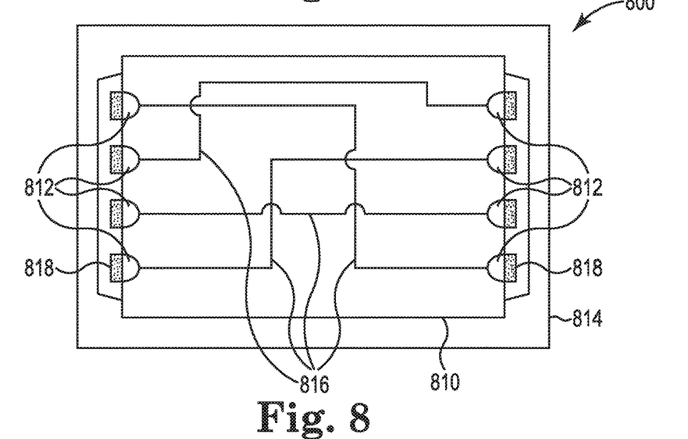
FIG. 8 depicts a configuration element installed on a PCBA using a socket having side-interfacing connectors, according to various embodiments.

FIG. 8 depicts a configuration element 810 installed on a PCBA 800 using a socket having side-interfacing connectors, according to various embodiments.

A shown configuration element 810 is shown installed in a side-interfacing connection socket 814, in contrast to other connection schemes described herein, such as BGA or LGA connection schemes. Connection socket 814, as shown, includes side connectors 818, which may be fixed or compliant, according to various embodiments. As depicted, connection socket 814 has eight side connectors 818. The configuration element 810 may include various bridging elements 816 (e.g., electrical traces, connections, or signal lanes), which, based on a layout, may adjust functionality of a PCBA connected to side-interfacing connection socket 814. Side connectors 818 may be configured to interface with a number of configuration element connectors 812 (e.g., electrical contact points). Configuration element 810 may be installable and/or removable from socket 814, but may include a mechanical detent (not shown) or may be held in the socket 814 using friction, etc. Alternative configuration elements may be different than configuration element 810, and may be swapped into socket 814 in place of configuration element 810 to change a functionality aspect of a PCBA connected to sockets 814. Other connector layouts are also contemplated, including mezzanine-style connections, among others.

Figure 9:
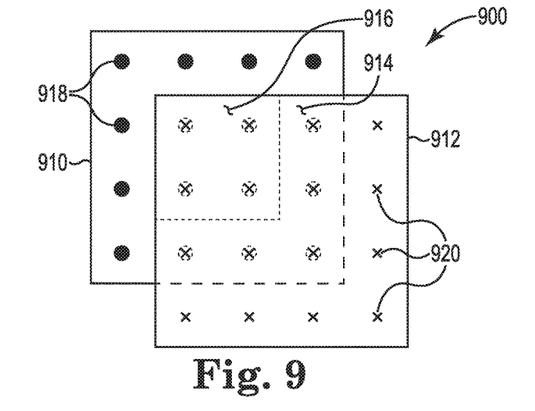
FIG. 9 illustrates various examples of configuration elements that vary in size, and are rotated or translated, according to various embodiments.

FIG. 9 illustrates various examples of configuration elements that vary in size, and are rotated or translated, according to various embodiments.

A connection array 910, as shown includes a plurality of ball grid contact points 918 (which may be similar to ball grid contact points 222 of FIG. 2). The connection array 910 may be a BGA, and may be connected to a PCBA (not shown), as described herein. The connection array 910 may be similar to connection array 710 as shown in FIG. 7. The connection array 910 may be connected to a PCBA may various methods, such as soldering or other bonding. One (or more) configuration element 912, 914, or 916 may be introduced to the connection array 910 in order to adjust one or more functions or capability of the PCBA (not shown).

Configuration elements 912, 914, and 916 may have various orientations and/or translated locations, and may have an axis of rotational symmetry. Configuration elements 912, 914, and 916 may be rotated from one orientation to another orientation and may be translated from a first location to a second location.

According to various embodiments, a single configuration element 912, 914, or 916 may be used in a number of varied PCBA configurations simply by rotating the element (90°, 180°, 270°, etc.). For example, various compatible pinout or topology variations could be achieved by arranging the various configuration element contact points 920 in a consistent fashion around the sides of a square configuration element (e.g., 912).

Configuration element 912, 914, and 916 are shown in square four-orientation rotatable configurations, but other configurations of number of potential operative orientations are contemplated, such as a rectangle having two orientations or a hexagon-shaped configuration element having six orientations.

Configuration element contact points 920 may be located on the various configuration elements 912, 914, or 916, and the configuration element contact points may form a BGA with a similar connector pitch to connection array 910. A configuration element, such as 912, may be operatively mounted on a PCB of a PCBA in a first orientation. In the first orientation, a first bridging element (not shown in FIG. 9) may provide an electrical connection between at least a pair of signal lanes selected from a plurality of signal lanes. An alternate configuration of configuration element 912 may include removing and rotating configuration element 912 and re-mounting configuration element in a second orientation. Once mounted in the second orientation, an alternate, second bridging element (not shown in FIG. 9) may connect at least a different pair of connections. Thus, a single configuration element 912, 914, or 916 may serve as multiple different configuration elements if configured to be rotatable to change electrical connections, using at least a first bridging element and a second bridging element.

In some embodiments of this disclosure, a configuration element 916 has a layout of two horizontal contact points (e.g., ball grid contact points 918) by two vertical contact points (2×2) and the configuration element 916 may be configured to include a number of configuration element contact points 920 substantially similar to a number of connections (e.g., ball grid contact points 918) on a PCBA connection interface, such as connection array 910. Various alternative configuration elements may also be introduced to connection array 910, such as a 3×3 configuration element 914, or a 4×4 configuration element 912. It should be noted that various configuration elements may have varied dimensions, including a width that does not match a respective height of the configuration element, further adding to permutations of configurability, both present and future.

Various forms of PCBAs, including various examples of application controller modules are described, herein. Such modules may be used within various modular storage platforms and enclosures. However, the various concepts described herein may be used in any other applicable environment.

In the detailed description, reference is made to the accompanying drawing that forms a part hereof and in which are shown by way of illustration at least one specific embodiment. The detailed description provides additional specific embodiments. It is to be understood that other embodiments are contemplated and may be made without departing from the scope or spirit of the present invention. The detailed description, therefore, is not to be taken in a limiting sense. While the present invention is not so limited, an appreciation of various aspects of the invention will be gained through a discussion of the examples provided.

It is understood that numerous variations of configuration elements for a PCBA could be made while maintaining the overall inventive design of various components thereof and remaining within the scope of the disclosure. Numerous alternate design or element features have been mentioned above.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Thus, embodiments of the PCBA having at least one configuration element are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A printed circuit board assembly, comprising: a printed circuit board having a plurality of signal lanes; at least one application-specific integrated circuit operatively mounted to the printed circuit board and connected with the plurality of signal lanes; and a first configuration element operatively mounted to the printed circuit board in a first orientation and at a first location and having a first bridging element for providing an electrical connection between at least a first pair of signal lanes selected from the plurality of signal lanes; the first configuration element also including a second bridging element so that if the first configuration element were operatively mounted to the printed circuit board in a different, second orientation relative to the printed circuit board, the second bridging element would provide an electrical connection between at least a second pair of signal lanes selected from the plurality of signal lanes without the first bridging element providing an electrical connection between the at least first pair of signal lanes.

2. The assembly of claim 1, wherein the printed circuit board is configured to operatively mount a second configuration element to the printed circuit board in a third orientation at the first location in place of the first configuration element, and wherein the second configuration element has a third bridging element for connecting at least a third pair of signal lanes selected from the plurality of signal lanes.

3. The assembly of claim 1, wherein the first configuration element is primarily passive.

4. The assembly of claim 1, wherein the first configuration element is operatively mounted to the printed circuit board in the second orientation relative to the printed circuit board, and wherein the first configuration element is operatively mounted to the printed circuit board at the first location.

5. The assembly of claim 1, wherein the first configuration element is operatively mounted to the printed circuit board in the second orientation relative to the printed circuit board at a second, translated location, wherein the first configuration element has a fourth bridging element for providing an electrical connection between at least a different pair of signal lanes selected from the plurality of signal lanes.

6. The assembly of claim 1, wherein the first configuration element includes multiple bridging elements for the first orientation and multiple bridging elements for the second orientation.

7. The assembly of claim 1, wherein the first configuration element can be rotated to change orientation from the first orientation to the second orientation.

8. The assembly of claim 1, wherein the first configuration element includes a stacked layer construction and the multiple bridging elements for use in the first orientation are provided on a different layer than the bridging elements for use in the second orientation.

9. The assembly of claim 1, wherein the application-specific integrated circuit is selected from the group consisting of: an input/output controller, a serial-attached small computer system interface fanout expander, a central processing unit, and an Ethernet switch.

10. A method of making a printed circuit board assembly comprising the steps of: mounting at least an application-specific integrated circuit to a printed circuit board and connecting the application-specific integrated circuit with a plurality of signal lanes; mounting a first configuration element to the printed circuit board in a first orientation, the first configuration element including a first set of bridging elements and a second set of bridging elements; and electrically connecting at least a bridging element of the first set of bridging elements between at least a pair of signal lanes of the printed circuit board without electrically connecting any bridging element of the second set of bridging elements between any signal lanes of the printed circuit board, when the first configuration element is mounted in the first orientation, and wherein the second set of bridging elements are connected when the first configuration element is mounted in a second orientation different than the first orientation.

11. The method of claim 10, wherein the printed circuit board is configured to operatively mount a second configuration element to the printed circuit board in a second orientation in place of the first configuration element, and wherein the second configuration element has a third set of bridging elements for electrically connecting at least a different pair of signal lanes selected from the plurality of signal lanes.

12. The method of claim 10, wherein the first configuration element is primarily passive.

13. The method of claim 10, wherein the application-specific integrated circuit is selected from the group consisting of: an input/output controller, a serial-attached small computer system interface fanout expander, a central processing unit, and an Ethernet switch.

14. A printed circuit board assembly, comprising: a printed circuit board having a plurality of signal lanes; at least one application-specific integrated circuit operatively mounted to the printed circuit board and connected with the plurality of signal lanes; and a first primarily passive configuration element operatively mounted to the printed circuit board in a first orientation and having a first bridging element for providing an electrical connection between at least a first pair of signal lanes selected from the plurality of signal lanes, if a second primarily passive configuration element having a different, second bridging element is operatively mounted to the printed circuit board in place of the first configuration element, the second bridging element would provides an electrical connection between at least only a second pair of signal lanes selected from the plurality of signal lanes without providing an electrical connection between the at least first pair of signal lanes.

15. The assembly of claim 14, wherein the second configuration element is mounted to the printed circuit board in a second orientation in place of the first configuration element.

16. The assembly of claim 14, wherein the first configuration element utilizes at least one of a land grid array connection and a ball grid array connection with the plurality of signal lanes.

17. The assembly of claim 14, wherein the second configuration element is operatively mounted to the printed circuit at a different, translated location than the first configuration element.

18. The assembly of claim 14, wherein the first configuration element can be rotated to change orientation from the first orientation to the second orientation, wherein the first configuration element has a third bridging element for providing an electrical connection between at least a third pair of signal lanes selected from the plurality of signal lanes without providing an electrical connection between the at least first pair of signal lanes.

19. An apparatus comprising:
a configuration module configured for operative mounting to a printed circuit board in a first orientation and at a first location and having a first bridging element for providing electrical connection between at least a first pair of signal lanes selected from a plurality of signal lanes, the configuration module also including a second bridging element configured to provide electrical connection between at least a second pair of signal lanes selected from the plurality of signal lanes when the configuration module is operatively mounted to the printed circuit board in a different, second orientation relative to the printed circuit board without the first bridging element providing an electrical connection between the at least first pair of signal lanes.

* * * * *